United States Patent
Huang et al.

(10) Patent No.: US 8,053,867 B2
(45) Date of Patent: Nov. 8, 2011

(54) PHOSPHOROUS-COMPRISING DOPANTS AND METHODS FOR FORMING PHOSPHOROUS-DOPED REGIONS IN SEMICONDUCTOR SUBSTRATES USING PHOSPHOROUS-COMPRISING DOPANTS

(75) Inventors: Hong Min Huang, Shanghai (CN); Carol Gao, Shanghai (CN); Zhe Ding, Shanghai (CN); Albert Peng, Shanghai (CN); Ya Qun Liu, Shanghai (CN)

(73) Assignee: Honeywell International Inc., Morristown, NJ (US)

( * ) Notice: Subject to any disclaimer, the term of this patent is extended or adjusted under 35 U.S.C. 154(b) by 506 days.

(21) Appl. No.: 12/194,688

(22) Filed: Aug. 20, 2008

(65) Prior Publication Data
US 2010/0048006 A1  Feb. 25, 2010

(51) Int. Cl.
*H01L 29/02* (2006.01)
*H01L 29/207* (2006.01)

(52) U.S. Cl. ............... 257/607; 257/610; 257/E21.137; 257/E21.466; 438/45; 438/558

(58) Field of Classification Search .................. 438/558, 438/562, 45, 563, 564, 918; 252/182.3, 183.13, 252/950; 257/102, 607, 609, 610, E21.137, 257/E21.466
See application file for complete search history.

(56) References Cited

U.S. PATENT DOCUMENTS

| | | | |
|---|---|---|---|
| 3,258,434 A | 6/1966 | Mackenzie et al. | |
| 3,960,605 A | 6/1976 | Beck et al. | |
| 4,102,766 A | 7/1978 | Fey | |
| 4,104,091 A | 8/1978 | Evans, Jr. et al. | |
| 4,236,948 A | 12/1980 | Seibold et al. | |
| 4,392,180 A | 7/1983 | Nair | |
| 4,478,879 A | 10/1984 | Baraona et al. | |
| 4,517,403 A | 5/1985 | Morel et al. | |
| 4,548,741 A | 10/1985 | Hormadaly | |
| 4,578,283 A | 3/1986 | Kirtley et al. | |
| 4,707,346 A | 11/1987 | Hormadaly | |
| 4,793,862 A | 12/1988 | Ishikawa et al. | |
| 4,891,331 A | 1/1990 | Rapp | |

(Continued)

FOREIGN PATENT DOCUMENTS

CN  101369612  2/2009

(Continued)

OTHER PUBLICATIONS

A simple processing sequence for selective emitters [Si solarcells]; Horzel, J., Szlufcik, J., Nijs J., Mertens, R, Imec, Heverlee; Photovoltaic Specialists Conference, 1997., Conference Record of the Twenty-Sixth IEEE; Sep. 29-Oct. 3, 1997; pp. 139-142; Meeting Date: Sep. 29, 1997-Oct. 3, 1997; Location: Anaheim, CA USA.

(Continued)

*Primary Examiner* — Matthew Smith
*Assistant Examiner* — Quovaunda V Jefferson
(74) *Attorney, Agent, or Firm* — Ingrassia Fisher & Lorenz, PC

(57) ABSTRACT

Phosphorous-comprising dopants, methods for forming phosphorous-doped regions in a semiconductor material, and methods for fabricating phosphorous-comprising dopants are provided. In one embodiment, a phosphorous-comprising dopant comprises a phosphorous source comprising a phosphorous-comprising salt, a phosphorous-comprising acid, phosphorous-comprising anions, or a combination thereof, an alkaline material, cations from an alkaline material, or a combination thereof, and a liquid medium.

38 Claims, 4 Drawing Sheets

U.S. PATENT DOCUMENTS

| | | | |
|---|---|---|---|
| 4,927,770 A | 5/1990 | Swanson | |
| 5,053,083 A | 10/1991 | Sinton | |
| 5,302,198 A | 4/1994 | Allman | |
| 5,399,185 A | 3/1995 | Berthold et al. | |
| 5,464,564 A | 11/1995 | Brown | |
| 5,472,488 A | 12/1995 | Allman | |
| 5,510,271 A | 4/1996 | Rohatgi et al. | |
| 5,527,389 A | 6/1996 | Rosenblum | |
| 5,527,872 A | 6/1996 | Allman | |
| 5,591,565 A | 1/1997 | Holdermann et al. | |
| 5,614,018 A | 3/1997 | Azuma et al. | |
| 5,641,362 A | 6/1997 | Meier | |
| 5,661,041 A | 8/1997 | Kano | |
| 5,665,845 A | 9/1997 | Allman | |
| 5,667,597 A | 9/1997 | Ishihara | |
| 5,695,809 A | 12/1997 | Chadha et al. | |
| 5,766,964 A | 6/1998 | Rohatgi et al. | |
| 5,899,704 A | 5/1999 | Schlosser et al. | |
| 5,928,438 A | 7/1999 | Salami et al. | |
| 6,091,021 A | 7/2000 | Ruby et al. | |
| 6,096,968 A | 8/2000 | Schlosser et al. | |
| 6,099,647 A | 8/2000 | Yieh et al. | |
| 6,143,976 A | 11/2000 | Endros | |
| 6,162,658 A | 12/2000 | Green et al. | |
| 6,180,869 B1 | 1/2001 | Meier et al. | |
| 6,221,719 B1 | 4/2001 | Franco | |
| 6,232,207 B1 | 5/2001 | Schindler | |
| 6,235,670 B1 * | 5/2001 | Benazzi et al. | 502/63 |
| 6,251,756 B1 | 6/2001 | Horzel et al. | |
| 6,262,359 B1 | 7/2001 | Meier et al. | |
| 6,297,134 B1 | 10/2001 | Ui et al. | |
| 6,300,267 B1 | 10/2001 | Chen et al. | |
| 6,309,060 B1 | 10/2001 | Timmermans-Wang et al. | |
| 6,355,581 B1 | 3/2002 | Vassiliev et al. | |
| 6,429,037 B1 | 8/2002 | Wenham et al. | |
| 6,479,885 B2 | 11/2002 | Buchanan et al. | |
| 6,518,087 B1 | 2/2003 | Furusawa et al. | |
| 6,552,414 B1 | 4/2003 | Horzel et al. | |
| 6,632,730 B1 | 10/2003 | Meier et al. | |
| 6,664,631 B2 | 12/2003 | Meier et al. | |
| 6,695,903 B1 | 2/2004 | Kubelbeck et al. | |
| 6,703,295 B2 | 3/2004 | Meier et al. | |
| 6,737,340 B2 | 5/2004 | Meier et al. | |
| 6,756,290 B1 | 6/2004 | Bultman | |
| 6,773,994 B2 | 8/2004 | Chittipeddi et al. | |
| 6,784,520 B2 | 8/2004 | Doi | |
| 6,825,104 B2 | 11/2004 | Horzel et al. | |
| 6,960,546 B2 | 11/2005 | Caspers et al. | |
| 6,998,288 B1 | 2/2006 | Smith et al. | |
| 7,029,943 B2 | 4/2006 | Kruhler | |
| 7,041,549 B2 | 5/2006 | Ootsuka | |
| 7,078,276 B1 | 7/2006 | Zurcher et al. | |
| 7,078,324 B2 | 7/2006 | Dudek et al. | |
| 7,097,788 B2 | 8/2006 | Kirkor et al. | |
| 7,108,733 B2 | 9/2006 | Enokido | |
| 7,115,216 B2 | 10/2006 | Carter et al. | |
| 7,129,109 B2 | 10/2006 | Munzer et al. | |
| 7,135,350 B1 | 11/2006 | Smith et al. | |
| 7,144,751 B2 | 12/2006 | Gee et al. | |
| 7,170,001 B2 | 1/2007 | Gee et al. | |
| 7,186,358 B2 | 3/2007 | McCulloch et al. | |
| 7,196,018 B2 | 3/2007 | Szlufcik et al. | |
| 7,217,883 B2 | 5/2007 | Munzer | |
| 7,278,728 B2 | 10/2007 | Desie et al. | |
| 7,332,445 B2 | 2/2008 | Lukas et al. | |
| 7,335,555 B2 | 2/2008 | Gee et al. | |
| 7,393,723 B2 | 7/2008 | Yamazaki et al. | |
| 7,402,448 B2 | 7/2008 | Narayanan et al. | |
| 7,456,084 B2 | 11/2008 | Jonczyk et al. | |
| 7,459,391 B2 | 12/2008 | Yoshizawa et al. | |
| 7,468,485 B1 | 12/2008 | Swanson | |
| 7,537,951 B2 | 5/2009 | Gambino et al. | |
| 7,559,494 B1 * | 7/2009 | Yadav et al. | 241/23 |
| 7,572,740 B2 | 8/2009 | Terry et al. | |
| 7,615,393 B1 | 11/2009 | Shah et al. | |
| 7,633,006 B1 | 12/2009 | Swanson | |
| 7,635,600 B2 | 12/2009 | Zhang et al. | |
| 7,638,438 B2 | 12/2009 | Eldershaw | |
| 2002/0046765 A1 | 4/2002 | Uematsu et al. | |
| 2002/0153039 A1 | 10/2002 | Moon et al. | |
| 2003/0134469 A1 | 7/2003 | Horzel et al. | |
| 2003/0153141 A1 | 8/2003 | Carter et al. | |
| 2004/0063326 A1 | 4/2004 | Szlufcik et al. | |
| 2004/0112426 A1 | 6/2004 | Hagino | |
| 2004/0242019 A1 | 12/2004 | Klein et al. | |
| 2004/0261840 A1 | 12/2004 | Schmit et al. | |
| 2005/0189015 A1 | 9/2005 | Rohatgi et al. | |
| 2005/0190245 A1 | 9/2005 | Desie et al. | |
| 2005/0268963 A1 | 12/2005 | Jordan et al. | |
| 2006/0060238 A1 | 3/2006 | Hacke et al. | |
| 2006/0105581 A1 | 5/2006 | Bielefeld et al. | |
| 2006/0162766 A1 | 7/2006 | Gee et al. | |
| 2006/0163744 A1 | 7/2006 | Vanheusden et al. | |
| 2006/0166429 A1 | 7/2006 | Chaudhry et al. | |
| 2006/0237719 A1 | 10/2006 | Colfer et al. | |
| 2007/0012355 A1 | 1/2007 | LoCascio et al. | |
| 2007/0034251 A1 | 2/2007 | Jonczyk et al. | |
| 2007/0075416 A1 | 4/2007 | Anderson et al. | |
| 2007/0151598 A1 | 7/2007 | De Ceuster et al. | |
| 2007/0157965 A1 | 7/2007 | Park | |
| 2007/0215203 A1 | 9/2007 | Ishikawa et al. | |
| 2007/0269923 A1 | 11/2007 | Lee et al. | |
| 2007/0290283 A1 | 12/2007 | Park et al. | |
| 2008/0026550 A1 | 1/2008 | Werner et al. | |
| 2008/0042212 A1 | 2/2008 | Kamath et al. | |
| 2008/0044964 A1 | 2/2008 | Kamath et al. | |
| 2008/0048240 A1 | 2/2008 | Kamath et al. | |
| 2008/0076240 A1 | 3/2008 | Veshetti et al. | |
| 2008/0092944 A1 | 4/2008 | Rubin | |
| 2008/0119593 A1 | 5/2008 | Stramel et al. | |
| 2008/0121279 A1 | 5/2008 | Swanson | |
| 2008/0138456 A1 | 6/2008 | Fork et al. | |
| 2008/0142075 A1 | 6/2008 | Reddy et al. | |
| 2008/0160733 A1 * | 7/2008 | Hieslmair et al. | 438/558 |
| 2008/0202576 A1 | 8/2008 | Hiesimair | |
| 2008/0210298 A1 | 9/2008 | Kuebelbeck et al. | |
| 2008/0241986 A1 | 10/2008 | Rohatgi et al. | |
| 2008/0241987 A1 | 10/2008 | Rohatgi et al. | |
| 2008/0241988 A1 | 10/2008 | Rohatgi et al. | |
| 2008/0251121 A1 | 10/2008 | Stone | |
| 2008/0264332 A1 | 10/2008 | Sepehry-Fard | |
| 2008/0268584 A1 | 10/2008 | Anderson et al. | |
| 2008/0290368 A1 | 11/2008 | Rubin | |
| 2008/0314288 A1 | 12/2008 | Biro et al. | |
| 2009/0007962 A1 | 1/2009 | Wenham et al. | |
| 2009/0007965 A1 | 1/2009 | Rohatgi et al. | |
| 2009/0017606 A1 | 1/2009 | Fath et al. | |
| 2009/0020156 A1 | 1/2009 | Ohtsuka et al. | |
| 2009/0020829 A1 | 1/2009 | Chandra et al. | |
| 2009/0068474 A1 | 3/2009 | Lower et al. | |
| 2009/0068783 A1 | 3/2009 | Borden | |
| 2009/0084440 A1 | 4/2009 | Wang et al. | |
| 2009/0142875 A1 | 6/2009 | Borden et al. | |
| 2009/0142911 A1 | 6/2009 | Asano et al. | |
| 2009/0183768 A1 | 7/2009 | Wenham et al. | |
| 2009/0194153 A1 | 8/2009 | Hilaii et al. | |
| 2009/0227061 A1 | 9/2009 | Bateman et al. | |
| 2009/0227097 A1 | 9/2009 | Bateman et al. | |
| 2009/0233426 A1 | 9/2009 | Poplavskyy et al. | |
| 2009/0239330 A1 | 9/2009 | Vanheusden et al. | |
| 2009/0239363 A1 | 9/2009 | Leung et al. | |
| 2009/0260684 A1 | 10/2009 | You | |
| 2009/0308440 A1 | 12/2009 | Adibi et al. | |
| 2009/0314341 A1 | 12/2009 | Borden et al. | |
| 2009/0314344 A1 | 12/2009 | Fork et al. | |
| 2010/0068848 A1 | 3/2010 | Kuo et al. | |

FOREIGN PATENT DOCUMENTS

| | | |
|---|---|---|
| EP | 0195148 A1 | 9/1986 |
| EP | 0381430 A2 | 1/1990 |
| EP | 485122 A1 | 5/1992 |
| EP | 0890980 A2 | 1/1999 |
| EP | 1024523 A1 | 8/2000 |
| EP | 0770265 B1 | 3/2002 |
| EP | 1843389 A1 | 10/2007 |
| EP | 1876651 A1 | 1/2008 |
| JP | 09-036853 A | 11/1997 |

| | | |
|---|---|---|
| JP | 2003168807 | 6/2003 |
| JP | 2003168810 | 6/2003 |
| JP | 2003-188393 | 7/2003 |
| JP | 2003224285 | 8/2003 |
| JP | 2004221149 | 8/2004 |
| JP | 2005038997 | 2/2005 |
| JP | 2007081300 | 3/2007 |
| KR | 10-199-0066346 A1 | 8/2008 |
| WO | 9715075 | 4/1997 |
| WO | 2006029250 A2 | 3/2006 |
| WO | 2007059577 A1 | 5/2007 |
| WO | 2007059578 A1 | 5/2007 |
| WO | 2007106502 A2 | 9/2007 |
| WO | 2007-111996 A2 | 10/2007 |
| WO | 2007118121 A2 | 10/2007 |
| WO | 2007-129966 | 11/2007 |
| WO | 2008039078 A2 | 4/2008 |
| WO | 2008054473 A2 | 5/2008 |
| WO | 2008085806 A1 | 7/2008 |
| WO | 2008098407 A1 | 8/2008 |
| WO | 2008141415 A1 | 11/2008 |
| WO | 2009010585 A2 | 1/2009 |
| WO | 2009013307 A2 | 1/2009 |
| WO | 2009032359 A2 | 3/2009 |
| WO | 2009052511 A2 | 4/2009 |
| WO | 2009067005 A1 | 5/2009 |
| WO | 2009085224 A2 | 7/2009 |
| WO | 2009088138 A1 | 7/2009 |
| WO | 2009094575 A2 | 7/2009 |
| WO | 2009107920 A1 | 9/2009 |
| WO | 2009116569 A1 | 9/2009 |
| WO | 2009126803 A2 | 10/2009 |
| WO | 2009152378 A1 | 12/2009 |

OTHER PUBLICATIONS

Accuglass P-114A Spin-On Glass, Material Safety Data Sheet, Honeywell International, Oct. 29, 2003, pp. 1-6.
Accuglass P-5S, Product Bulletin, Thin-Film Dielectrics, Honeywell International, 2002, pp. 1-2.
Accuglass P-TTY A Series Phosphosilicate Spin-On Glasses, Allied Signal, Inc. Planarization and Diffusion Products, May 1992, pp. 1-2.
Accuglass P-TTY Product Bulletin, Thin-Film Dielectrics, Honeywell International, 2002, pp. 1-2.
Accuglass P-XXY Spin-On Glass, Material Safety Data Sheet, Honeywell International, May 14, 2003, pp. 1-7.
Diffusion Technology Phosphorus Spin-On Dopants P-8 Series (P-8545, P854 (2:1), Material Safety Data Sheet, Honeywell International, Apr. 25, 2003, pp. 1-7.
Accuspin Boron; Polymers for All P-Type Diffusion, Honeywell International, 2005, pp. 1-2.
B-30, B-40, B-50, B-60 Spin-On Dopants, Material Safety Data Sheet, Honeywell International, Apr. 29, 2003, pp. 1-7.
BoronPlus, High Purity Planar Doparits, ISO Certified 3002/14001, Technegias Technical Products, 2000.
Spin-On Dopants, Thin Film—Dielectrics, Application Compassion, Honeywell International, 2002, pp. 1-2.
Techniglas Technical Products, Boron Plus, Product Information, pp. 1-3.
Zable, J.L., Splatter During Ink Jet Printing, IBM J. Res. Develop., Jul. 1977, pp. 315-320.
Horzel, J. et al., A Simple Processing Sequence for Selective Emitters, 26th PVSC, Sep. 30-Oct. 3, 1997.
Tonooka, K.; Shimokawa, K; Nishimura, O Fluorescent Properties of Tb-doped Borosilicate Glass Films Prepared by a Sol-gel Method Proceedings of SPIE—The International Society for Optical Engineering, v 4282, p. 193-199, 2001.
Yun, Yongsup; Yoshida, Takanori; Shimazu, Norifumi; Inoue, Yasushi; Saito, Nagahiro; Takai, Osamu Behavior of Various Organosilicon Molecules in PECVD Processes for Hydrocarbon-doped Silicaon Oxide Films Diffusion and Defect Data Pt.B Solid State Phenomena, v 124-126, n Part 1, p. 347-350, 2007, Advances in Nanomaterials and Processing—IUMRS.
Tajima, Nobuo; Ohno, Takahisa; Hamada, Tomoyuki; Yoneda, Katsumi; Kondo, Seiichi; Kobayashi, Nobuyoshi; Shinriki, Manabu; Inaishi, Yoshiaki; Miyazawa, Kazuhiro; Sakota, Kaoru; Hasaka, Satoshi; Inoue, Minoru Carbon-doped Silicon Oxide Films with Hydrocarbon Network Bonds for Low-k Dielectrics, theoretical Investigations Japanese Journal of Applied Physics, Part 1: Regular Papers and Short Notes and Review Papers, v 46, n 9A, p.
Takeda, Satoshi1; Fukawa, Makoto1 Surface Modification of Sputtered SiO2 Thin Films by Metal Doping Materials Research Society Symposium—Proceedings, v 750, p. 443-448, 2002.
Sabbah, H.; Conde, J.P.; Chu, V.; Zebda, A.; Ababou-Girard, S.; Solal, F.; Godet, C. Thermal Grafting of Fluorinated Molecular Monolayers on Doped Amorphous Silicon surfaces Journal of Applied Physics, v 105, n 6, 2009.
Osada, Yoshihito; Takase, Mitsuo Plasma-polymerized Organosilioxane Membranes Prepared by Simultaneous Doping of i2 Molecules and the Effect on Liquid Permeability Journal of Polymer Science, Part A-1, Polymer Chemistry, v 23, n 9, p. 2425-2439, Sep. 1985.
Popov, V.P.1; Safronov, L.N.1; Nikiforov, A.I.1 Atomically Flat Surface of Hydrogen Transferred Si Film with Boron Delta Doped Layer Meeting Abstracts, p. 526, 2005, 207th Meeting of the Electrochemical Society—Meeting Abstracts.
Li, Jiangtian1; Shi, Jianlin1; Zhang, Lingxia1; Hua, Zile1; Jiang, Peng1; Huang, Weimin1; Wei, Chenyang1 A Pre-modification-direct Synthesis Route for the Covalent Incorporation and Monomeric Dispersion of Hydrophobic Organic Chromophores in Mesoporous Silica Films Microporous and Mesoporous Materials, v 111, n 1-3, p. 150-156, Apr. 15, 2008.
Ruge, Ingolf et al. "Halbleiter Technologie," Publication: Berlin; New York: Springer-Verlag; Edition: 2., überarbeitete und erw. Aufl./ von Hermann Mader. Year: 1984; Description: 404 p. 218 ill.; 24 cm.; Language: German; Series: Halbleiter-Elektronik; Bd. 4; Variation: Halbleiter-Elektronik; Bd. 4. Standard No. ISBN: 0387126619 (U.S.); 9780387126616 (U.S.); 3540126619; 9783540126614; National Library: 831027150 LCCN: 85-106745.

* cited by examiner

PHOSPHOROUS-COMPRISING DOPANTS AND METHODS FOR FORMING PHOSPHOROUS-DOPED REGIONS IN SEMICONDUCTOR SUBSTRATES USING PHOSPHOROUS-COMPRISING DOPANTS

FIELD OF THE INVENTION

The present invention generally relates to dopants and methods for doping regions of semiconductor-comprising materials, and more particularly relates to phosphorous-comprising dopants for forming phosphorous-doped regions in semiconductor materials and methods for forming phosphorous-doped regions in semiconductor materials.

BACKGROUND OF THE INVENTION

Doping of semiconductor materials with conductivity-determining type impurities, such as n-type and p-type elements, is used in a variety of applications that require modification of the electrical characteristics of the semiconductor materials. Photolithography is a well-known method for performing such doping of semiconductor materials. To dope a semiconductor material, photolithography requires the use of a mask that is formed and patterned on the semiconductor materials. Ion implantation is performed to implant conductivity-determining type ions into the semiconductor materials. A high-temperature anneal then is performed to cause the impurity dopants to diffuse into the semiconductor materials.

In some applications, such as, for example, solar cells, it is desirable to dope the semiconductor materials in a pattern having very fine lines or features. The most common type of solar cell is configured as a large-area p-n junction made from silicon. In one type of such solar cell 10, illustrated in FIG. 1, a silicon wafer 12 having a light-receiving front side 14 and a back side 16 is provided with a basic doping, wherein the basic doping can be of the n-type or of the p-type. The silicon wafer is further doped at one side (in FIG. 1, front side 14) with a dopant of opposite charge of the basic doping, thus forming a p-n junction 18 within the silicon wafer. Photons from light are absorbed by the light-receiving side 14 of the silicon wafer to the p-n junction where charge carriers, i.e., electrons and holes, are separated and conducted to a conductive contact, thus generating electricity. The solar cell is usually provided with metallic contacts 20, 22 on the light-receiving front side as well as on the back side, respectively, to carry away the electric current produced by the solar cell. The metal contacts on the light-receiving front side pose a challenge in regard to the degree of efficiency of the solar cell because the metal covering of the front side surface causes shading of the effective area of the solar cell. Although it may be desirable to reduce the metal contacts as much as possible to reduce the shading, a metal covering of approximately 10% remains unavoidable since the metallization has to occur in a manner that keeps the electrical losses small. In addition, contact resistance within the silicon adjacent to the electrical contact increases significantly as the size of the metal contact decreases. However, a reduction of the contact resistance is possible by doping the silicon in narrow areas 24 directly adjacent to the metal contacts on the light-receiving front side 14.

FIG. 2 illustrates another common type of solar cell 30. Solar cell 30 also has a silicon wafer 12 having a light-receiving front side 14 and a back side 16 and is provided with a basic doping, wherein the basic doping can be of the n-type or of the p-type. The light-receiving front side 14 has a rough or textured surface that serves as a light trap, preventing absorbed light from being reflected back out of the solar cell. The metal contacts 32 of the solar cell are formed on the back side 16 of the wafer. The silicon wafer is doped at the backside relative to the metal contacts, thus forming p-n junctions 18 within the silicon wafer. Solar cell 30 has an advantage over solar cell 10 in that all of the metal contacts of the cell are on the back side 16. In this regard, there is no shading of the effective area of the solar cell. However, for all contacts to be formed on the back side 16, the doped regions adjacent to the contacts have to be quite narrow.

Phosphorous is commonly used to form n-type regions in semiconductor materials. Both solar cell 10 and solar cell 30 benefit from the use of very fine, narrow phosphorous-doped regions formed within a semiconductor substrate. However, the present-day method of doping described above, that is, photolithography, presents significant drawbacks. For example, while doping of substrates in fine-lined patterns is possible with photolithography, photolithography is an expensive and time consuming process.

Accordingly, it is desirable to provide phosphorous-comprising dopants that can be used in doping processes that result in fine-featured patterns. In addition, it is desirable to provide methods for forming phosphorous-comprising dopants that can be used in doping processes that are time and cost efficient. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Phosphorous-comprising dopants, methods for forming phosphorous-doped regions in a semiconductor material, and methods for fabricating phosphorous-comprising dopants are provided. In accordance with an exemplary embodiment of the present invention, a phosphorous-comprising dopant comprises a phosphorous source comprising a phosphorous-comprising salt, a phosphorous-comprising acid, phosphorous-comprising anions, or a combination thereof, an alkaline material, cations from an alkaline material, or a combination thereof, and a liquid medium.

In accordance with another exemplary embodiment of the present invention, a method for forming phosphorous-doped regions in a semiconductor material comprises providing a phosphorous-comprising dopant formed using a phosphorous-comprising acid, a phosphorous-comprising salt, or a combination thereof in a liquid medium. The phosphorous-comprising dopant is deposited overlying the semiconductor material using a non-contact printing process. The liquid medium of the phosphorous-comprising dopant is caused to evaporate and phosphorous elements of the phosphorous-comprising dopant are diffused into the semiconductor material.

In accordance with a further exemplary embodiment of the present invention, a method of forming a phosphorous-comprising dopant comprises providing a phosphorous source comprising a phosphorous-comprising acid or salt, or a combination thereof, and combining the phosphorous source with an alkaline material and a liquid medium.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Phosphorous-comprising dopants for forming phosphorous-doped regions in semiconductor materials, methods for fabricating such phosphorous-comprising dopants, and methods for forming phosphorous-doped regions in semiconductor material using such phosphorous-comprising dopants are provided herein. The phosphorous-doped regions are formed using a "doping process." As used herein, the term "doping process" includes, but is not limited to, "non-contact printing processes."

Figure 1:
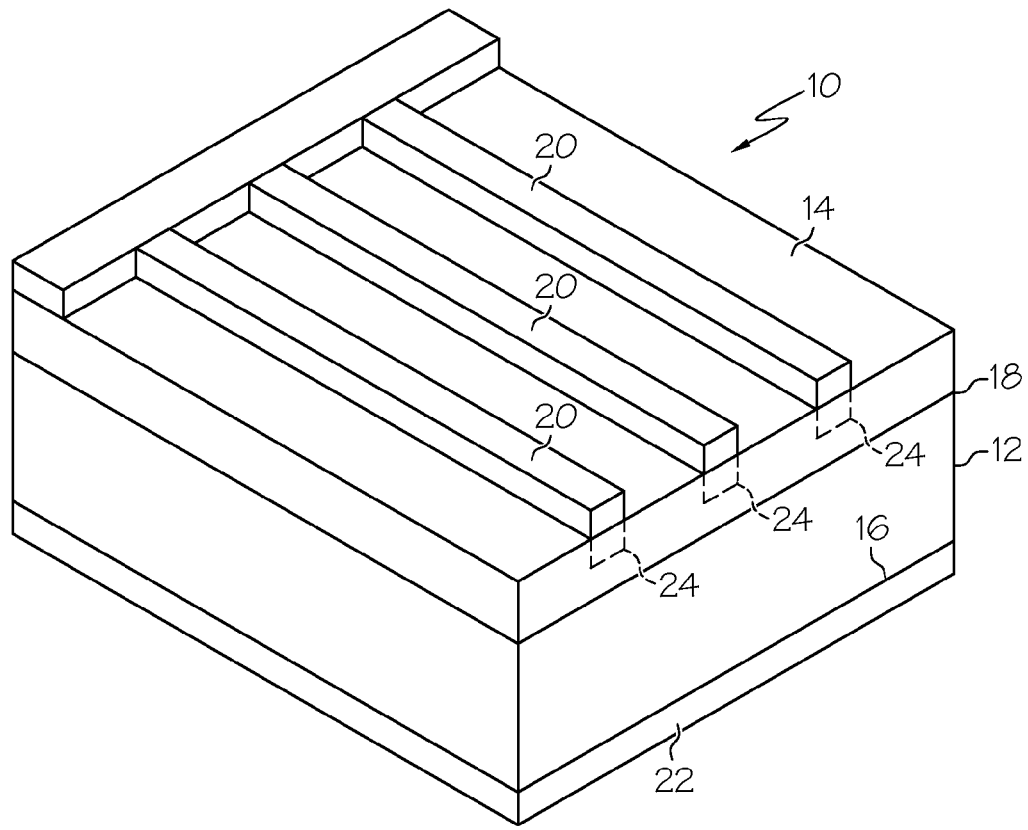
FIG. 1 is a schematic illustration of a conventional solar cell with a light-side contact and a back side contact.
Figure 2:
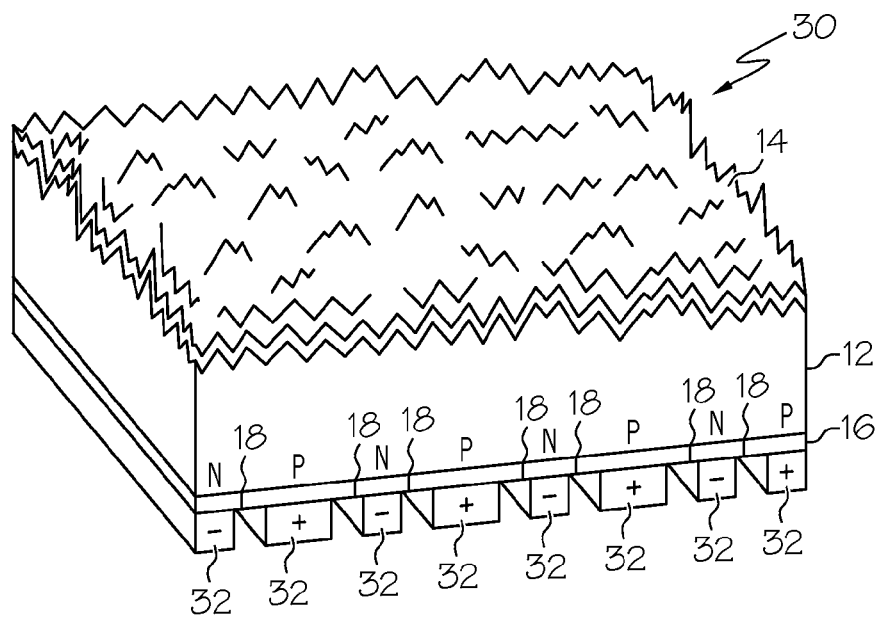
FIG. 2 is a schematic illustration of another conventional solar cell with back side contacts.
Figure 3:
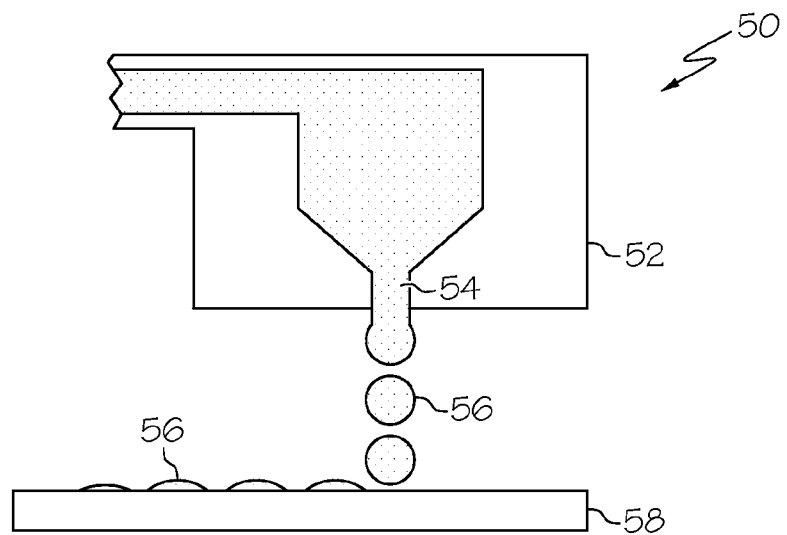
FIG. 3 is a cross-sectional view of an inkjet printer mechanism distributing ink on a substrate.
Figure 4:
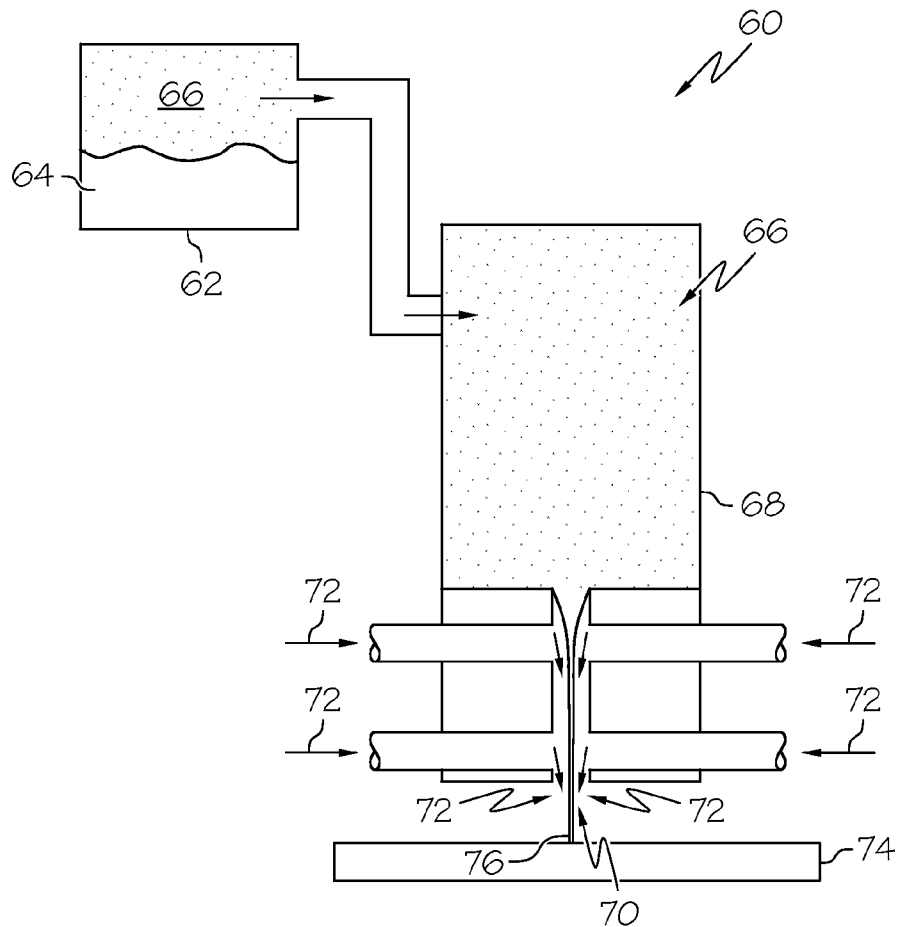
FIG. 4 is a cross-sectional view of an aerosol jet printer mechanism distributing ink on a substrate.

Examples of non-contact printing processes include but are not limited to "inkjet printing" and "aerosol jet printing." Typically, the terms "inkjet printing," an "inkjet printing process," "aerosol jet printing," and an "aerosol jet printing process" refer to a non-contact printing process whereby a fluid is projected from a nozzle directly onto a substrate to form a desired pattern. In an inkjet printing mechanism 50 of an inkjet printer, as illustrated in FIG. 3, a print head 52 has several tiny nozzles 54, also called jets. As a substrate 58 moves past the print head 52, or as the print head 52 moves past the substrate, the nozzles spray or "jet" ink 56 onto the substrate in tiny drops, forming images of a desired pattern. An aerosol jet printing mechanism 60, illustrated in FIG. 4, uses a mist generator or nebulizer 62 that atomizes a fluid 64. The atomized fluid 66 is aerodynamically focused using a flow guidance deposition head 68, which creates an annular flow of sheath gas, indicated by arrow 72, to collimate the atomized fluid 66. The co-axial flow exits the flow guidance head 68 through a nozzle 70 directed at the substrate 74, which serves to focus a stream 76 of the atomized material to as small as a tenth of the size of the nozzle orifice (typically 100 μm). Patterning is accomplished by attaching the substrate to a computer-controlled platen, or by translating the flow guidance head while the substrate position remains fixed.

Such non-contact printing processes are particularly attractive processes for fabricating doped regions in semiconductor materials for a variety of reasons. First, only a dopant that is used to form the doped regions touches or contacts the surface of the substrate upon which the dopant is applied. Thus, because the breaking of semiconductor substrates could be minimized compared to other known processes, non-contact processes are suitable for a variety of substrates, including rigid and flexible substrates. In addition, such non-contact processes are additive processes, meaning that the dopant is applied to the substrate in the desired pattern. Thus, steps for removing material after the printing process, such as is required in photolithography, are eliminated. Further, because such non-contact processes are additive processes, they are suitable for substrates having smooth, rough, or textured surfaces. Non-contact processes also permit the formation of very fine features on semiconductor materials. In one embodiment, features, such as, for example, lines, dots, rectangles, circles, or other geometric shapes, having at least one dimension of less than about 200 microns (μm) can be formed. In another exemplary embodiment, features having at least one dimension of less than about 100 μm can be formed. In a preferred embodiment, features having at least one dimension of less than about 20 μm can be formed. In addition, because non-contact processes involve digital computer printers that can be programmed with a selected pattern to be formed on a substrate or that can be provided the pattern from a host computer, no new masks or screens need to be produced when a change in the pattern is desired. All of the above reasons make non-contact printing processes cost-efficient processes for fabricating doped regions in semiconductor materials, allowing for increased throughput compared to photolithography.

However, while non-contact printing processes are preferred methods for forming doped regions in a semiconductor material in accordance with certain exemplary embodiments of the present invention, the invention is not so limited and, in other exemplary embodiments, the phosphorous-comprising dopants can be deposited using other application processes such as screen printing, spray application, spin application, and roller application. Screen printing involves the use of a patterned screen or stencil that is disposed over a semiconductor material. Liquid dopant is placed on top of the screen and is forced through the screen to deposit on the semiconductor material in a pattern that corresponds to the pattern of the screen. Spin application involves spinning the semiconductor material at a high spin speed such as, for example, up to 1200 revolutions per minute or even higher, while spraying the liquid dopant onto the spinning semiconductor material at a desired fluid pressure. Spinning causes the liquid dopant to spread outward substantially evenly across the semiconductor material. The liquid dopant also can be sprayed onto an unmoving semiconductor material at a desired fluid pressure at a position substantially at the center of the semiconductor material. The fluid pressure causes the dopant to spread radially and substantially evenly across the wafer. Roller printing involves a roller upon which is engraved a pattern. The liquid dopant is applied to the engraved pattern of the roller, which is pressed against a semiconductor material and rolled across the semiconductor material, thereby transferring the liquid dopant to the semiconductor material according to the pattern on the roller.

Figure 5:
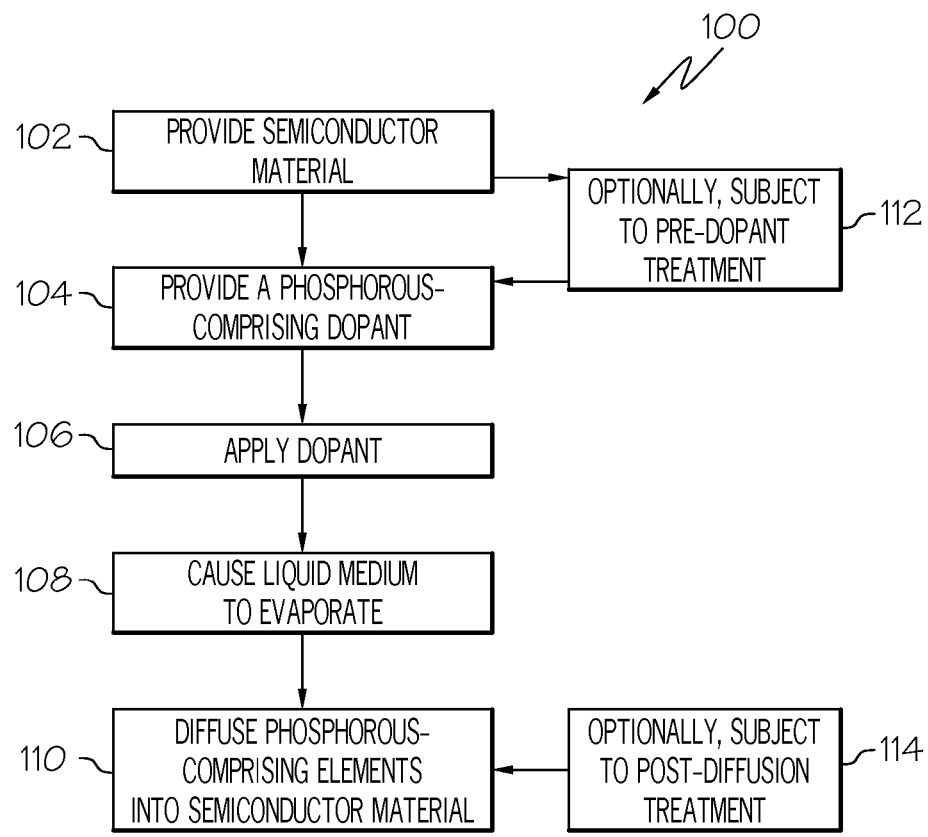
FIG. 5 is a flowchart of a method for forming phosphorous-doped regions in a semiconductor material using a non-contact printing process in accordance with an exemplary embodiment of the present invention.

Referring to FIG. 5, in accordance with an exemplary embodiment, a method 100 for forming a phosphorous-doped region in a semiconductor material includes the step of providing a semiconductor material (step 102). As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In this regard, the method 100 can be used to fabricate a variety semiconductor devices including, but not limited to, microelectronics, solar cells, displays, RFID components, microelectromechanical systems (MEMS) devices, optical devices such as microlenses, medical devices, and the like.

In an optional embodiment, the semiconductor material is subjected to a pre-dopant treatment (step 112). A pre-dopant treatment is any treatment that facilitates adhesion and performance of formed pattern of a subsequently-applied dopant, described in more detail below, to the semiconductor material or that facilitates diffusion of the phosphorous elements of the subsequently-applied dopant into the semiconductor material. For example, pre-dopant treatments include cleaning of the semiconductor material to remove particles, native oxides, organic or inorganic contamination, or the like from the semiconductor material, or treating the semiconductor material so that it becomes more hydrophilic or hydrophobic. Examples of pre-dopant treatment includes applying to the semiconductor material acids, such as hydrofluoric acid (HF), hydrochloric acid (HCl), sulfuric acid ($H_2SO_4$), and/or nitric acid ($HNO_3$), bases, such as ammonium hydroxide ($NH_4OH$), sodium hydroxide (NaOH), potassium hydroxide (KOH), tetramethylammonium hydroxide (TMAH), oxidizers, such as hydrogen peroxide ($H_2O_2$), solvents, such as water, acetone, isopropyl alcohol (IPA), ethanol, and/or tetrahydrofuran (THF), heating the semiconductor material to a temperature no higher than 800° C., or a combination thereof.

The method 100 further includes the step of providing a phosphorous-comprising dopant (step 104), which step may be performed before, during or after the step of providing the semiconductor material. Methods for fabricating such a dopant are described in more detail in reference to FIG. 6. In an exemplary embodiment of the present invention, the dopant is formulated so that it can be printed to form fine or small features, such as lines, dots, circles, squares, or other geometric shapes. In one exemplary embodiment of the invention, the dopant is formulated so that features having at least one dimension of less than about 200 μm can be printed. In another exemplary embodiment of the invention, the dopant is formulated so that features having at least one dimension less than about 100 μm can be printed. In a preferred embodiment of the present invention, the dopant is formulated so that features having a dimension of less than about 20 μm can be printed. In another exemplary embodiment, during the printing process and during pausing of the printing process, the dopant results in minimal, if any, clogging of the inkjet printer nozzles. Clogging of the nozzles results in down-time of the printer, thus reducing throughput. In a further exemplary embodiment, the ink is formulated so that, after it is deposited on the substrate and high-temperature annealing (discussed in more detail below) is performed, the resulting doped region has a sheet resistance in the range of no less than about 1 ohms/square (Ω/sq.).

Figure 6:
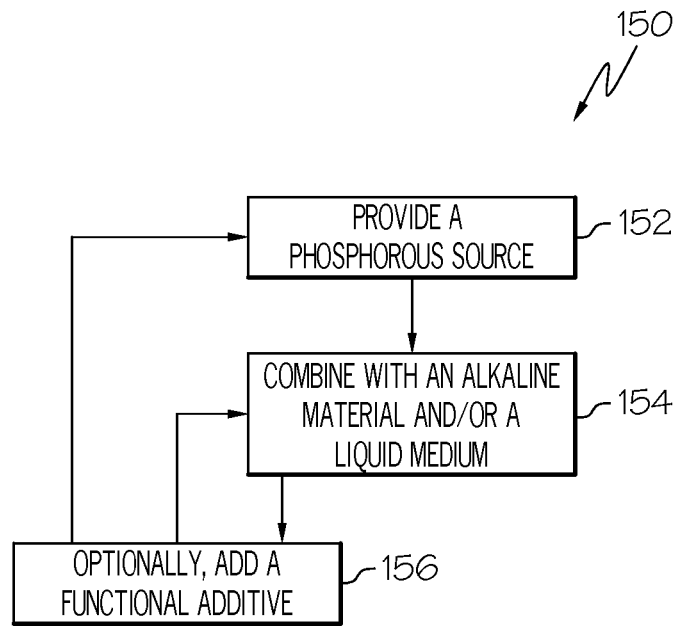
FIG. 6 is a flowchart of a method for fabricating a phosphorous-comprising dopant for use in the method of FIG. 5 in accordance with an exemplary embodiment of the present invention.

Referring momentarily to FIG. 6, in accordance with an exemplary embodiment of the present invention, a method 150 for fabricating a phosphorous-comprising dopant, such as that used in the method of FIG. 5, includes the step of providing a phosphorous source (step 152). Phosphorous-comprising dopants used in the method of FIG. 5 may be manufactured using a variety of inorganic or organic non-metal-comprising phosphorous sources. In a preferred embodiment of the invention, the phosphorous source is an inorganic, non-metal, phosphorous-comprising acid, phosphorous-comprising salt, or a combination thereof. Examples of inorganic and organic phosphorous-comprising acids include, but are not limited to, phosphoric acid ($H_3PO_4$), phosphorous acid ($H_3PO_3$), hypophosphorous acid ($H_3PO_2$), pyrophosphoric acid ($H_4P_2O_7$), acids having the formula $HR_1R_2PO_2$ and $H_2RPO_3$, where R, $R_1$, and $R_2$ are alkyls, aryls, or combinations thereof. Examples of inorganic and organic phosphorous-comprising salts include, but are not limited to, ammonium phosphate (($NH_4)_3PO_4$), ammonium dihydrogen phosphate ($NH_4H_2PO_4$), diammonium hydrogen phosphate (($NH_4)_2HPO_4$), ammonium phosphite (($NH_4)_3PO_3$), diammonium hydrogen phosphite (($NH_4)_2HPO_3$), ammonium dihydrogen phosphite ($NH_4H_2PO_3$), ammonium hypophosphite (($NH_4)_3PO_2$), diammonium hydrogen hypophosphite (($NH_4)_2HPO_2$), ammonium dihydrogen hypophosphite ($NH_4H_2PO_2$), ammonium pyrophosphate (($NH_4)_4P_2O_4$), triammonium hydrogen pyrophosphate (($NH_4)_3HP_2O_4$), diammonium dihydrogen pyrophosphate (($NH_4)_2H_2P_2O_4$), ammonium trihydrogen pyrophosphate ($NH_4H_3P_2O_4$), and phosphate salts having the formula ($NR_3R_4R_5R_6)_3PO_4$, ($NR_3R_4R_5H)_3PO_4$, ($NR_3R_4H_2)_3PO_4$, ($NR_3H_3)_3PO_4$, where $R_3$, $R_4$, $R_5$, and $R_6$ are alkyls, aryls, or combinations thereof. Alternatively, a phosphorous-comprising salt can be formed, such as in a liquid medium and/or an alkaline material described in more detail below, to form a phosphorous-comprising source. The phosphorous concentration of a resulting doped region in a semiconductor material depends, at least in part, on the concentration of the phosphorous elements of the phosphorous source in the phosphorous-comprising dopant. However, while it may be preferable to have as high a concentration of the phosphorous elements as is possible in the dopant without instability problems, in one embodiment of the invention, the phosphorous source is present in the phosphorous-comprising dopant so that the dopant has a pH in the range of from about 0 to about 10. In this regard, the pH of the phosphorous-comprising dopant can be controlled so as to minimize the corrosive effects of the dopant on the nozzle and/or any other part of the non-contact process printer. In a preferred embodiment, the phosphorous-comprising dopant has a pH of about from 6 to 7. In another embodiment of the invention, the phosphorous element of the phosphorous source comprises no greater than about 60% by weight of the phosphorous-comprising dopant.

The method further includes combining the phosphorous source with an alkaline material, a liquid medium, or both an alkaline material and a liquid medium (step 154). Examples of liquid mediums suitable for use in formulating the phosphorous-comprising dopant include alcohols, such as methanol, ethanol, propanol, 2-propanol, isopropanol (IPA), butanol, pentanol, and ethylene glycol, and other solvents such as N-methylpyrrolidone (NMP), propylene glycol methyl ether acetate (PGMEA), ethyl acetate, dimethyl formamide (DMF), glycerol, tetrahydrofuran (THF), water and mixtures thereof. In one exemplary embodiment, the liquid medium comprises no greater than about 95% by volume of the phosphorous-comprising dopant.

Alkaline materials may be used in the phosphorous-comprising dopant to at least partially neutralize the phosphorous source so that the resulting dopant has a pH in the range of from about 0 to about 10. In one exemplary embodiment, the alkaline material is present in the resulting dopant so that the dopant has a pH in the range of from about 6 to about 7. In another exemplary embodiment, the alkaline material comprises no greater than about 50% by weight of the phosphorous-comprising dopant. Alkaline materials suitable for use in forming the phosphorous-comprising dopant include any non-metal alkaline materials that are soluble in the liquid medium, if present. Examples of alkaline materials suitable for use in the phosphorous-comprising dopant include, but are not limited to, ammonia alkaline materials such as ammonia hydroxide $(NH_4)OH$, tetramethylammonium hydroxide (TMAH), $(NR_7R_8R_9R_{10})OH$, $(NR_7R_8R_9H)OH$, $(NR_7R_8H_2)OH$, $(NR_7H_3)OH$, where $R_7$, $R_8$, $R_9$, and $R_{10}$ are alkyls, aryls, or the like, or any combination thereof.

The phosphorous source and the liquid medium and/or the alkaline material are mixed using any suitable mixing or stirring process that forms a homogeneous solution. For example, a reflux condenser, a low speed sonicator or a high shear mixing apparatus, such as a homogenizer, a microfluidizer, a cowls blade high shear mixer, an automated media mill, or a ball mill, may be used for several seconds to an hour or more to form the phosphorous-comprising dopant. It will be appreciated that, while the phosphorous source, the liquid medium and the alkaline material can be in the form of separate components added together, it will be appreciated that two or more of the components can be combined together first, followed by the addition of the third component. For example, the alkaline material may be provided in the form of an aqueous alkaline material composition, in which the water portion of the composition comprises at least a portion of the liquid medium of the resulting dopant. Alternatively, the phosphorous source may be provided in the form of an aqueous phosphorous source composition, in which the water portion of the composition comprises at least a portion of the liquid medium of the resulting dopant.

In an optional exemplary embodiment of the invention, a functional additive is added to the phosphorous source before, during, and/or after combination with the liquid medium and/or the alkaline material (step 156). For example, it may be desirable to minimize the amount of the resulting phosphorous-comprising dopant that spreads beyond the penned area, that is, the area upon which the dopant is deposited, into unpenned areas of the semiconductor material before the predetermined annealing temperature of the annealing process is reached. Spreading of the phosphorous and/or phosphorous-comprising dopant beyond the penned area into unpenned areas before annealing can significantly affect the electrical characteristics of the resulting semiconductor device that utilizes the subsequently-formed doped region. Thus, in a further exemplary embodiment, a viscosity modifier is added. Examples of such viscosity-modifiers include glycerol, polyethylene glycol, polypropylene glycol, ethylene glycol/propylene glycol copolymer, organo-modified siloxanes, ethylene glycol/siloxane copolymers, polyelectrolyte, oleic acid and the like, and combinations thereof. Examples of other suitable additives that may be used to form the phosphorous-comprising dopant include dispersants, surfactants, polymerization inhibitors, wetting agents, antifoaming agents, detergents and other surface-tension modifiers, flame retardants, pigments, plasticizers, thickeners, rheology modifiers, and mixtures thereof.

Figure 7:
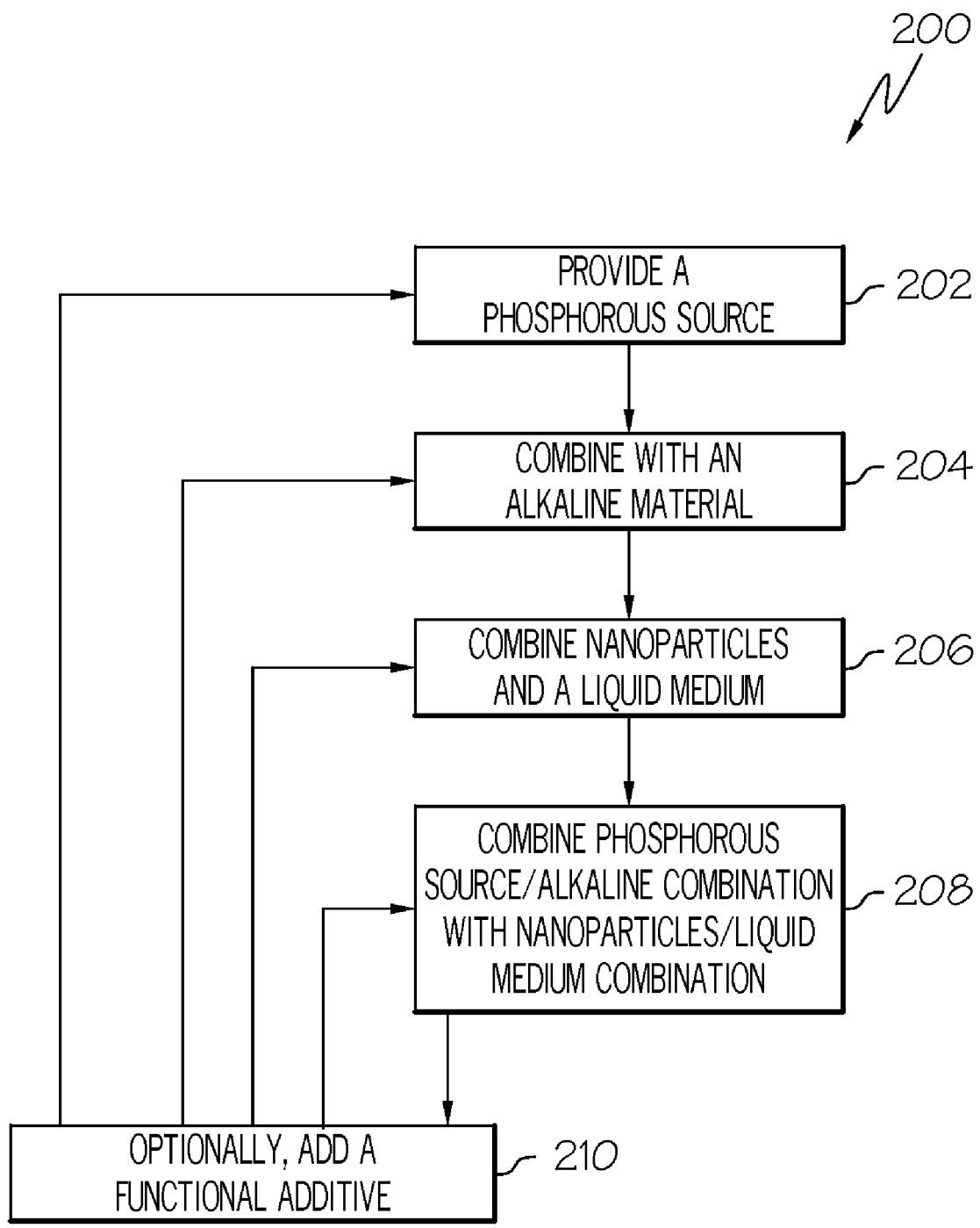
FIG. 7 is a flowchart of a method for fabricating a phosphorous-comprising dopant for use in the method of FIG. 5 in accordance with another exemplary embodiment of the present invention.

In another exemplary embodiment of the present invention, nanoparticles may be added to the phosphorous-comprising dopant to modify the viscosity, surface tension, and/or wettability of the dopant and thereby permit deposition of the dopant on the semiconductor material so that features with very fine dimensions can be achieved. FIG. 7 illustrates a method 200 for fabricating a phosphorous-comprising dopant, such as that used in the method of FIG. 5, in accordance with another exemplary embodiment of the invention. As with method 150 of FIG. 6, method 200 includes the step of providing a phosphorous source (step 202). Any of the phosphorous sources described above with respect to step 152 of method 150 can be used. The phosphorous source is combined with an alkaline material (step 204). Any of the alkaline materials described above with reference to step 154 of method 150 can be used and any of the methods discussed above for combining the components may be used. A liquid medium, such as any of the liquid mediums set forth above, also can be added to the phosphorous source.

Method 200 further includes combining nanoparticles with a liquid medium (step 206). The nanoparticles may include any nanoparticles that have an average particle size of no greater than 1 μm and that modify the viscosity, surface tension, and/or wettability of the dopant. The term "particle size" includes a diameter, a length, a width or any other suitable dimension used to characterize a size of a nanoparticle. Examples of nanoparticles suitable for use include silica nanoparticles, such as Aerosil® 380, available from Evonik Degussa Gmbh of Frankfurt, Germany, and other oxide nanoparticles. The liquid medium may comprise any of the liquid mediums set forth above for step 154 of method 150 and may be combined with the nanoparticles using any of the methods for combining set forth above.

After combination of the nanoparticles and the liquid medium, the phosphorous source/alkaline material combination and the nanoparticles/liquid medium combination can be mixed, using any of the methods described above, to form the phosphorous-comprising dopant (step 208). In one embodiment of the invention, the phosphorous-comprising dopant has a pH in the range of from about 0 to about 10. In a preferred embodiment, the phosphorous-comprising dopant has a pH of about from 6 to 7. In another embodiment of the invention, the phosphorous source comprises no greater than about 60% by weight of the phosphorous-comprising dopant, the alkaline material comprises about greater than zero and no greater than about 50% by weight of the phosphorous-comprising dopant, the liquid medium comprises about greater than zero and no greater than about 60% by volume of the phosphorous-comprising dopant, and the nanoparticles comprise no greater than about 10% by weight of the phosphorous-comprising dopant. While method 200 illustrates that the phosphorous source and the alkaline material are combined to form a first combination and the nanoparticles and the liquid medium are combined to form a second combination with the first and second combinations then mixed to form the dopant, it will be understood that the phosphorous source, the alkaline material, the nanoparticles and the liquid medium can be combined in any suitable sequence that satisfactorily forms the phosphorous-comprising dopant. In an optional exemplary embodiment of the invention, a functional additive is added to the phosphorous source before, during, or after combination with the alkaline material, the nanoparticles and/or the liquid medium (step 210).

Depending on the liquid medium and/or alkaline material used in the dopant, the phosphorous source may or may not disassociate to form phosphorous-comprising anions such as, for example, $H_2PO_4^-$, $HPO_4^{2-}$, $PO_4^{3-}$, $H_2PO_3^-$, $HPO_3^{2-}$, $PO_3^{3-}$, $H_2PO_2^-$, $HPO_2^{2-}$, $PO_2^{3-}$, $H_3P_2O_4^-$, $H_2P_2O_4^{2-}$, $HP_2O_4^{3-}$, $P_2O_4^{4-}$, $R_{11}R_{12}PO_2^-$, $HRPO_3^-$, and $R_{11}PO_3^{2-}$, where $R_{11}$ and $R_{12}$ are alkyls, aryls, or combinations thereof.

In addition, the amount of liquid medium and/or alkaline material used may determine, at least in part, the extent of dissociation of the phosphorous source. Further, the interaction of the liquid medium and the alkaline material may determine, at least in part, the extent to which the alkaline material disassociates to form cations and hydroxide anions. Accordingly, upon formation, the phosphorous-comprising dopant may comprise a phosphorous-comprising salt, a phosphorous comprising acid, phosphorous-comprising anions, or combinations thereof, an alkaline material and/or cations from an alkaline material, and/or a liquid medium and, optionally, a functional additive.

Referring back to FIG. 5, the method 100 continues with the application of the phosphorous-comprising dopant overlying the semiconductor material (step 106). As used herein, the term "overlying" encompasses the terms "on" and "over". Accordingly, the dopant can be applied directly onto the semiconductor material or may be deposited over the semiconductor material such that one or more other materials are interposed between the dopant and the semiconductor material. Examples of materials that may be interposed between the dopant and the semiconductor material are those materials that do not obstruct diffusion of the phosphorous elements of the phosphorous-comprising dopant into the semiconductor material during annealing. Such materials include phosphosilicate glass, borosilicate glass, silicon nitride, or silicon oxide that forms on a silicon material. Typically such materials are removed before dopants are deposited on the silicon material; however, in various embodiments, it may be preferable to omit the removal process, thereby permitting the materials to remain on the semiconductor material.

In an exemplary embodiment, the phosphorous-comprising dopant is applied overlying the semiconductor material using a non-contact process printer. In this regard, the phosphorous-comprising dopant is applied overlying the semiconductor material in a pattern that is stored in or otherwise supplied to the printer. An example of an inkjet printer suitable for use includes, but is not limited to, Dimatix Inkjet Printer Model DMP 2831 available from Fujifilm Dimatix, Inc. of Santa Clara, Calif. An example of an aerosol jet printer suitable for use includes, but is not limited to, the M3D Aerosol Jet Deposition System available from Optomec, Inc. of Albuquerque, N. Mex. In another exemplary embodiment, the phosphorous-comprising dopant is applied overlying the semiconductor material by spraying, spinning, or rolling the dopant, as described above. Preferably, the dopant is applied to the substrate at a temperature in the range of about 15° C. to about 350° C. in a humidity of about 20 to about 80%.

Once the dopant is applied overlying the semiconductor material, the liquid medium in the dopant and any water that formed from the reaction of hydrogen cations (from a phosphorous-comprising acid) and hydroxide anions (from an alkaline material) is caused to evaporated (step 108). In this regard, the liquid medium and/or water may be permitted to evaporate at room temperature (about 16° C. to about 28° C.) or may be heated to the boiling point of the liquid medium for a sufficient time to permit the liquid medium to evaporate. Preferably, the liquid medium and/or water is evaporated at a temperature no greater than 800° C.

After the pattern of phosphorous-comprising dopant is formed on the semiconductor material, phosphorous elements, in an ionic state, as part of a compound, or as a combination of both, of the dopant are caused to diffuse into the semiconductor material (step 110). In an exemplary embodiment, the semiconductor material is subjected to a high-temperature thermal treatment or "anneal" to cause the phosphorous elements of the phosphorous-comprising dopant to diffuse into the semiconductor material, thus forming phosphorous-doped regions within the material (step 110). The anneal can be performed using any suitable heat-generating method, such as, for example, electrical heating, infrared heating, laser heating, microwave heating, and the like. The time duration and the temperature of the anneal is determined by such factors as the initial phosphorous concentration of the phosphorous-comprising dopant, the thickness of the dopant deposit, the desired concentration of the resulting phosphorous-doped region, and the depth to which the phosphorous is to diffuse. In one exemplary embodiment of the present invention, the substrate is placed inside an oven wherein the temperature is ramped up to a temperature in the range of about 800° C. to about 1200° C. and the semiconductor material is baked at this temperature for about 2 to about 180 minutes. Annealing also may be carried out in an in-line furnace to increase throughput. The annealing atmosphere may contain 0 to 100% oxygen in an oxygen/nitrogen or oxygen/argon mixture. In a preferred embodiment, the semiconductor material is subjected to an anneal temperature of about 1050° C. for about from 5 to about 10 minutes in an oxygen ambient. In another embodiment, the semiconductor material is subjected to an anneal temperature of about 950° C. for about 10 to about 180 minutes in an oxygen ambient. In yet another embodiment, the semiconductor material is subjected to an anneal temperature of about 850° C. for about 10 to about 300 minutes in an oxygen ambient.

In an optional exemplary embodiment, the semiconductor material then is subjected to a post-diffusion treatment (step 114). The post-diffusion treatment removes any residues, such as, for example, phosphosilicate glass, phosphorous oxide, silicon oxide or contamination that form during annealing of the semiconductor material. If such residue is not removed after annealing, it may have deleterious affects on the performance of a subsequently-formed device. For example, such residue may dramatically increase the contact resistance between doped semiconductor material and a metal contact formed thereon. Examples of post-diffusion treatment include subjecting the semiconductor material to acids, such as hydrofluoric acid (HF), hydrochloric acid (HCl), sulfuric acid ($H_2SO_4$), and/or nitric acid ($HNO_3$), bases, such as ammonium hydroxide ($NH_4OH$), sodium hydroxide (NaOH), potassium hydroxide (KOH), tetramethylammonium hydroxide (TMAH), oxidizers, such as hydrogen peroxide ($H_2O_2$), solvents, such as water, acetone, isopropyl alcohol (IPA), ethanol, and/or tetrahydrofuran (THF), heating the semiconductor material to a temperature no higher than 800° C., or a combination thereof.

The following are examples of phosphorous-comprising dopants for use in fabricating doped regions of semiconductor materials. The examples are provided for illustration purposes only and are not meant to limit the various embodiments of the present invention in any way.

EXAMPLE 1 in a 1 liter (L) glass vessel, 8.3 parts by volume 85% phosphoric acid was combined with 33.3 parts by volume ethylene glycol and 58.3 parts by volume 25% TMAH aqueous solution. The solution was stirred at room temperature for thirty minutes using an electromagnetic stirrer. The solution then was filtered using a 0.45 μm polyvinylidine fluoride (PVDF) filter to obtain a phosphorous-comprising dopant. The pH of the dopant was 7. The phosphorous-comprising dopant was deposited on a bare P-type silicon wafer using a 1 picoliter (pL) nozzle of a Dimatix Inkjet Printer Model DMP 2831 with 15 µm drop spacing. The silicon wafer was baked at 200° C. for about 10 minutes. A 25 µm dopant line width on the silicon wafer was achieved.

EXAMPLE 2

Approximately 100 milliliter (mL) ethylene glycol was added to a 250 mL glass vessel. Approximately 1 gram (g) of Aerosil® 380 fumed silica was added to the ethylene glycol and the mixture was mixed for about 15 minutes using a Heat Systems—Ultrasonics Inc. ultrasonic processor Model W-375 to form a uniform dispersion. Approximately 100 mL deionized water was added to a 500 mL glass vessel. Approximately 150 g 50% TMAH aqueous solution and 70 mL 85% phosphoric acid aqueous solution were added to the water and the resulting solution was stirred for thirty minutes using an electromagnetic stirrer. Approximately 100 mL of the silica/ethylene glycol dispersion was combined with 100 mL of the water/TMAH/phosphoric acid solution and the mixture was stirred for approximately thirty minutes continuously using an electromagnetic stirrer to obtain a phosphorous-comprising dopant. The pH of the dopant was 7. The phosphorous-comprising dopant was deposited on a bare P-type silicon wafer using a 1 pL nozzle of a Dimatix Inkjet Printer Model DMP 2831 with 12 µm drop spacing. The silicon wafer was baked at 200° C. for about 10 minutes. A 20 µm dopant line width on the silicon wafer was achieved.

EXAMPLE 3

In a 1 L glass vessel, 16.6 parts by volume 85% phosphoric acid aqueous solution was combined with 25.0 parts by volume ethylene glycol and 58.3 parts 25% TMAH aqueous solution. The solution was stirred at room temperature for thirty minutes using an electromagnetic stirrer. The solution then was filtered using a 0.45 µm PVDF filter to obtain a phosphorous-comprising dopant. The pH of the dopant was 2.5. The phosphorous-comprising dopant was deposited on a bare P-type silicon wafer using a 1 pL nozzle of a Dimatix Inkjet Printer Model DMP 2831 with 15 µm drop spacing. The silicon wafer was baked at 200° C. for about 10 minutes and then was subjected to a belt furnace at 980° C. for about 3 hours. After deglazing with diluted hydrofluoric acid (DHF), a 3.5 ohm/sq sheet resistance on the doped silicon wafer was achieved.

EXAMPLE 4

In a 1 L glass vessel, 40 parts by volume 85% phosphoric acid aqueous solution was combined with 60 parts by volume 25% TMAH aqueous solution. The solution was stirred at room temperature for thirty minutes using an electromagnetic stirrer. The solution then was filtered using a 0.45 µm PVDF filter to obtain a phosphorous-comprising dopant. A textured P-type silicon wafer was baked at 200° C. for about 20 minutes and then was allowed to cool. The phosphorous-comprising dopant was deposited on the textured silicon wafer using a 10 pL nozzle of a Dimatix Inkjet Printer Model DMP 2831 with 20 µm drop spacing. The silicon wafer was baked at 200° C. for about 10 minutes and then was baked at 350° C. for 10 minutes. A 280 µm dopant line width on the silicon wafer was achieved.

Accordingly, phosphorous-comprising dopants for forming phosphorous-doped regions in semiconductor materials, methods for fabricating such phosphorous-comprising dopants, and methods for forming phosphorous-doped regions in semiconductor material using such phosphorous-comprising dopants have been provided. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A phosphorous-comprising dopant comprising:
   a phosphorous source comprising a phosphorous-comprising salt, a phosphorous-comprising acid, phosphorous-comprising anions, or a combination thereof;
   a hydrocarbon group-comprising alkaline material, cations from a hydrocarbon group-comprising alkaline material, or a combination thereof;
   a liquid medium; and
   nanoparticles.

2. The phosphorous-comprising dopant of claim 1, wherein the phosphorous source comprise an inorganic, nonmetal, phosphorous-comprising acid, an inorganic, nonmetal, phosphorous-comprising salt, or a combination thereof.

3. The phosphorous-comprising dopant of claim 1, wherein the phosphorous source comprises a phosphorous-comprising acid selected from the group consisting of phosphoric acid ($H_3PO_4$), phosphorous acid ($H_3PO_3$), hypophosphorous acid ($H_3PO_2$), pyrophosphoric acid ($H_4P_2O_7$), and acids having the formula $HR_1R_2PO_2$ and $H_2RPO_3$, where R, $R_1$, and $R_2$ are alkyls, aryls, or combinations thereof.

4. The phosphorous-comprising dopant of claim 1, wherein the phosphorous source comprises a phosphorous-comprising salt selected from the group consisting of ammonium phosphate (($NH_4$)$_3PO_4$), ammonium dihydrogen phosphate ($NH_4H_2PO_4$,), diammonium hydrogen phosphate (($NH_4$)$_2HPO_4$), ammonium phosphite (($NH_4$)$_3PO_3$), diammonium hydrogen phosphite (($NH_4$)$_2HPO_3$), ammonium dihydrogen phosphite ($NH_4H_2PO_3$), ammonium hypophosphite (($NH_4$)$_3PO_2$), diammonium hydrogen hypophosphite (($NH_4$)$_2HPO_2$), ammonium dihydrogen hypophosphite ($NH_4H_2PO_2$), ammonium pyrophosphate (($NH_4$)$_4P_2O_4$), triammonium hydrogen pyrophosphate (($NH_4$)$_3HP_2O_4$), diammonium dihydrogen pyrophosphate (($NH_4$)$_2H_2P_2O_4$), ammonium trihydrogen pyrophosphate ($NH_4H_3P_2O_4$), and phosphate salts having the formula ($NR_3R_4R_5R_6$)$_3PO_4$, ($NR_3R_4R_5H$)$_3PO_4$, ($NR_3R_4H_2$)$_3PO_4$, ($NR_3H_3$)$_3PO_4$, where $R_3$, $R_4$, $R_5$, and $R_6$ are alkyls, aryls, or combinations thereof.

5. The phosphorous-comprising dopant of claim 1, wherein the phosphorous-comprising dopant has a pH in a range of from about 0 to about 10.

6. The phosphorous-comprising dopant of claim 5, wherein the phosphorous-comprising dopant has a pH in a range of from about 6 to about 7.

7. The phosphorous-comprising dopant of claim 1, wherein the phosphorous element of the phosphorous source comprises no greater than about 60% by weight of the phosphorous-comprising dopant.

8. The phosphorous-comprising dopant of claim 1, wherein the liquid medium is selected from the group consisting of alcohols, N-methylpyrrolidone (NMP), propylene glycol methyl ether acetate (PGMEA), ethyl acetate, dimethyl formamide (DMF), glycerol, tetrahydrofuran (THF), water, and mixtures thereof.

9. The phosphorous-comprising dopant of claim 1, wherein the liquid medium comprises no greater than about 95% by volume of the phosphorous-comprising dopant.

10. The phosphorous-comprising dopant of claim 1, wherein the hydrocarbon group-comprising alkaline material comprises greater than about zero and no greater than about 50% by weight of the phosphorous-comprising dopant.

11. The phosphorous-comprising dopant of claim 1, wherein the hydrocarbon group-comprising alkaline material comprises an ammonia alkaline material.

12. The phosphorous-comprising dopant of claim 1, further comprising nanoparticles having an average particle size of no greater than about 1 µm.

13. The phosphorous-comprising dopant of claim 1, wherein the nanoparticles comprise no greater than about 10% by weight of the phosphorous-comprising dopant.

14. The phosphorous-comprising dopant of claim 1, wherein the hydrocarbon group-comprising alkaline material comprises an ammonium alkaline material.

15. A method for forming phosphorous-doped regions in a semiconductor material, the method comprising the steps of:
providing a phosphorous-comprising dopant formed using a phosphorous-comprising acid, a phosphorous-comprising salt, or a combination thereof, a hydrocarbon group-comprising alkaline material, and nanoparticles in a liquid medium;
depositing the phosphorous-comprising dopant overlying the semiconductor material;
optionally, causing the liquid medium of the phosphorous-comprising dopant to evaporate; and
diffusing phosphorous elements of the phosphorous-comprising dopant into the semiconductor material.

16. The method of claim 15, wherein the step of providing comprises the step of providing a phosphorous-comprising dopant formed using a phosphorous-comprising acid selected from the group consisting of phosphoric acid ($H_3PO_4$), phosphorous acid ($H_3PO_3$), hypophosphorous acid ($H_3PO_2$), pyrophosphoric acid ($H_4P_2O_7$), and acids having the formula $HR_1R_2PO_2$ and $H_2RPO_3$, where R, $R_1$, and $R_2$ are alkyls, aryls, or combinations thereof.

17. The method of claim 15, wherein the step of providing comprises the step of providing a phosphorous-comprising dopant formed using a phosphorous-comprising salt selected from the group consisting of ammonium phosphate (($NH_4)_3PO_4$), ammonium dihydrogen phosphate ($NH_4H_2PO_4$,), diammonium hydrogen phosphate (($NH_4)_2HPO_4$), ammonium phosphite (($NH_4)_3PO_3$), diammonium hydrogen phosphite (($NH_4)_2HPO_3$), ammonium dihydrogen phosphite ($NH_4H_2PO_3$), ammonium hypophosphite (($NH_4)_3PO_2$), diammonium hydrogen hypophosphite (($NH_4)_2HPO_2$), ammonium dihydrogen hypophosphite ($NH_4H_2PO_2$), ammonium pyrophosphate (($NH_4)_4P_2O_7$), triammonium hydrogen pyrophosphate (($NH_4)_3HP_2O_7$), diammonium dihydrogen pyrophosphate (($NH_4)_2H_2P_2O_7$), ammonium trihydrogen pyrophosphate ($NH_4H_3P_2O_7$), and phosphate salts having the formula $(NR_3R_4R_5R_6)_3PO_4$, $(NR_3R_4R_5H)_3PO_4$, $(NR_3R_4H_2)_3 PO_4$, $(NR_3H_3)_3PO_4$, where $R_3$, $R_4$, $R_5$, and $R_6$ are alkyls, aryls, or combinations thereof.

18. The method of claim 15, wherein the step of providing comprises the step of providing a phosphorous-comprising dopant having a pH in a range of from about 0 to about 10.

19. The method of claim 15, wherein the step of providing comprises the step of providing a phosphorous-comprising dopant comprising a liquid medium selected from the group consisting of alcohols, N-methylpyrrolidone (NMP), propylene glycol methyl ether acetate (PGMEA), ethyl acetate, dimethyl formamide (DMF), glycerol, tetrahydrofuran (THF), water and mixtures thereof.

20. The method of claim 15, wherein the step of providing comprises the step of providing a phosphorous-comprising dopant formed using an ammonia hydrocarbon group-comprising alkaline material.

21. The method of claim 15, wherein the step of providing comprises the step of providing a phosphorous-comprising dopant formed using nanoparticles having an average particle size of no greater than about 1 µm.

22. The method of claim 15, wherein the step of depositing is performed by a non-contact printing process.

23. The method of claim 15, wherein the step of causing comprises the step of permitting the liquid medium to evaporate at a temperature no greater than about 800° C.

24. The method of claim 15, wherein the step of diffusing comprises the step of annealing the semiconductor material using high-temperature thermal annealing, laser annealing, or microwave annealing.

25. The method of claim 15, further comprising, before the step of depositing, the step of subjecting the semiconductor material to a pre-dopant treatment.

26. The method of claim 25, wherein the step of subjecting comprises applying to the semiconductor material an acid, a base, an oxidizer, a solvent, or a combination thereof, or heating the semiconductor material to a temperature no higher than 800° C., or a combination of applying and heating.

27. The method of claim 15, further comprising, after the step of diffusing, the step of subjecting the semiconductor material to a post-diffusion treatment.

28. The method of claim 27, wherein the step of subjecting comprises applying to the semiconductor material an acid, a base, an oxidizer, a solvent, or a combination thereof, or heating the semiconductor material to a temperature no higher than 800° C., or a combination of applying and heating.

29. The method of claim 15, wherein the step of depositing comprises depositing the phosphorous-comprising dopant overlying the semiconductor material using a screen printing process.

30. A method of forming a phosphorous-comprising dopant, the method comprising the steps of:
providing a phosphorous source comprising a phosphorous-comprising acid, a phosphorous-comprising salt, or a combination thereof; and
combining the phosphorous source with a hydrocarbon group-comprising alkaline material, nanoparticles, and a liquid medium.

31. The method of claim 30, wherein the step of providing comprises providing a phosphorous source comprising a phosphorous-comprising acid selected from the group consisting of phosphoric acid ($H_3PO_4$), phosphorous acid ($H_3PO_3$), hypophosphorous acid ($H_3PO_2$), pyrophosphoric acid ($H_4P_2O_7$), and acids having the formula $HR_1R_2PO_2$ and $H_2RPO_3$, where R, $R_1$, and $R_2$ are alkyls, aryls, or combinations thereof.

32. The method of claim 30, wherein the step of providing comprises providing a phosphorous source comprising a phosphorous-comprising salt selected from the group consisting of ammonium phosphate (($NH_4)_3PO_4$), ammonium dihydrogen phosphate ($NH_4H_2PO_4$,), diammonium hydrogen phosphate (($NH_4)_2HPO_4$), ammonium phosphite (($NH_4)_3 PO_3$), diammonium hydrogen phosphite (($NH_4)_2 HPO_3$), ammonium dihydrogen phosphite ($NH_4H_2PO_3$), ammonium hypophosphite (($NH_4$)$_3PO_2$), diammonium hydrogen hypophosphite (($NH_4$)$_2HPO_2$), ammonium dihydrogen hypophosphite ($NH_4H_2PO_2$), ammonium pyrophosphate (($NH_4$)$_4P_2O_4$), triammonium hydrogen pyrophosphate (($NH_4$)$_3$ $HP_2O_4$), diammonium dihydrogen pyrophosphate (($NH_4$)$_2$ $H_2P_2O_4$), ammonium trihydrogen pyrophosphate ($NH_4H_3P_2O_4$), and phosphate salts having the formula ($NR_3R_4R_5R_6$)$_3PO_4$, ($NR_3R_4R_5H$)$_3PO_4$, ($NR_3R_4H_2$)$_3PO_4$, ($NR_3H_3$)$_3PO_4$, where $R_3$, $R_4$, $R_5$, and $R_6$ are alkyls, aryls, or combinations thereof.

33. The method of claim 30, wherein the step of combining comprises combining the phosphorous source with a liquid medium selected from the group consisting of alcohols, N-methylpyrrolidone (NMP), propylene glycol methyl ether acetate (PGMEA), ethyl acetate, dimethyl formamide (DMF), glycerol, tetrahydrofuran (THF), water, and mixtures thereof.

34. The method of claim 30, wherein the step of combining comprises combining the phosphorous source with an ammonia hydrocarbon group-comprising alkaline material.

35. The method of claim 30, wherein the step of combining comprises the step of combining the phosphorous source with the nanoparticles having an average particle size of no greater than about 1 μm.

36. A phosphorous-comprising dopant comprising:
a phosphorous source comprising a phosphorous-comprising salt, a phosphorous-comprising acid, phosphorous-comprising anions, or a combination thereof;
an a hydrocarbon group-comprising alkaline material, cations from an a hydrocarbon group-comprising alkaline material, or a combination thereof; and
a liquid medium; and
silica nanoparticles.

37. The phosphorous-comprising dopant of claim 36, wherein the silica nanoparticles have an average particle size of no greater than 1 μm.

38. The phosphorous-comprising dopant of claim 36, wherein the silica nanoparticles comprise no greater than about 10% by weight of the phosphorous-comprising dopant.

* * * * *